(12) United States Patent
Woo et al.

(10) Patent No.: US 12,371,816 B2
(45) Date of Patent: Jul. 29, 2025

(54) METAL-GRAPHENE COMPOSITE

(71) Applicants: SEOUL NATIONAL UNIVERSITY R&DB FOUNDATION, Seoul (KR); GRAPHENE SQUARE INC., Suwon-si (KR); Dankook University Cheonan Campus Industry Academic Cooperation Foundation, Cheonan-si (KR)

(72) Inventors: Yun Sung Woo, Yongin-si (KR); Byung Hee Hong, Suwon-si (KR); Dong Jin Kim, Suwon-si (KR)

(73) Assignees: SEOUL NATIONAL UNIVERSITY R&DB FOUNDATION, Seoul (KR); GRAPHENE SQUARE INC., Gy (KR)

( * ) Notice: Subject to any disclaimer, the term of this patent is extended or adjusted under 35 U.S.C. 154(b) by 193 days.

(21) Appl. No.: 17/743,667

(22) Filed: May 13, 2022

(65) Prior Publication Data
US 2022/0364264 A1    Nov. 17, 2022

(30) Foreign Application Priority Data
May 14, 2021    (KR) .......................... 10-2021-0062963

(51) Int. Cl.
| | | |
|---|---|---|
| B32B 15/00 | (2006.01) | |
| B32B 9/00 | (2006.01) | |
| B32B 15/04 | (2006.01) | |
| C30B 25/18 | (2006.01) | |
| C30B 29/02 | (2006.01) | |

(52) U.S. Cl.
CPC .............. *C30B 29/02* (2013.01); *C30B 25/18* (2013.01)

(58) Field of Classification Search
CPC ......... C30B 29/02; C30B 25/18; B32B 15/00; B32B 15/04; B32B 9/007
See application file for complete search history.

(56) References Cited

U.S. PATENT DOCUMENTS

| | | | |
|---|---|---|---|
| 2011/0091647 A1* | 4/2011 | Colombo ................ | C23C 16/26 427/249.1 |
| 2019/0368032 A1* | 12/2019 | Harutyunyan .......... | C23C 16/46 |
| 2021/0091368 A1* | 3/2021 | House ................... | H01M 4/525 |

FOREIGN PATENT DOCUMENTS

| | | |
|---|---|---|
| JP | 2018-56119 A | 4/2018 |
| KR | 20110092207 A | 8/2011 |
| KR | 10-2014-0024561 A | 3/2014 |
| KR | 101386104 B1 | 4/2014 |
| KR | 20170122442 A | 11/2017 |
| KR | 20180132382 A | 12/2018 |
| WO | 2019220903 A1 | 11/2019 |

OTHER PUBLICATIONS

Kim, Dong Jin et al., Ultrahigh-strength multi-layer graphene-coated Ni film with interface-induced hardening, Elsevier, Carbon 178, Mar. 21, 2021, pp. 497-505.
Office Action issued in Korean Patent Application No. 10-2021-0062963 dated Oct. 20, 2022, 6 pages.

* cited by examiner

*Primary Examiner* — Joanna Pleszczynska
(74) *Attorney, Agent, or Firm* — DILWORTH IP, LLC

(57) ABSTRACT

The present disclosure may provide a metal-graphene composite having excellent mechanical properties.

6 Claims, 15 Drawing Sheets

[Figure 1]
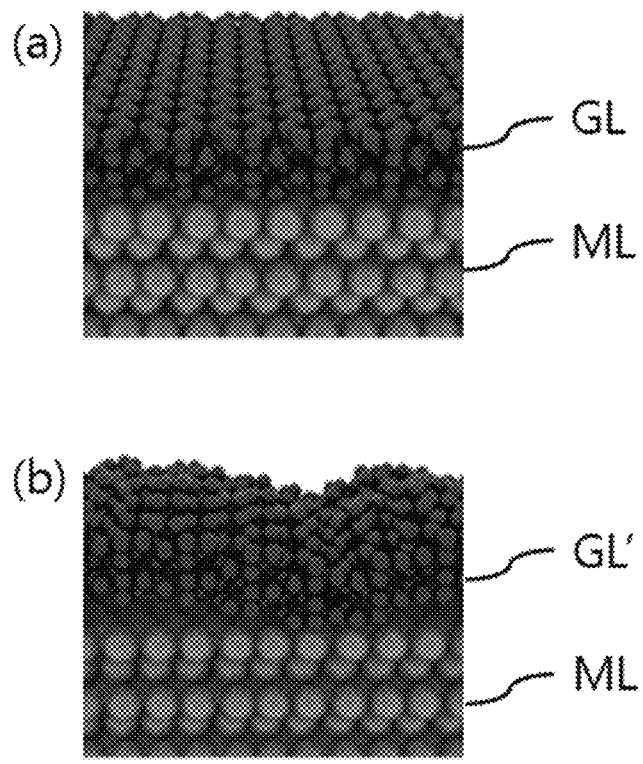

[Figure 2]
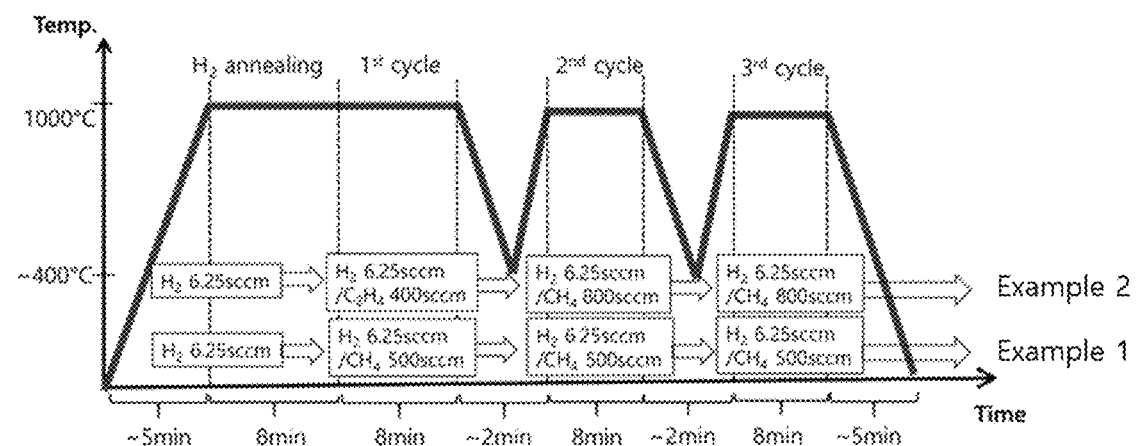
[Figure 3]
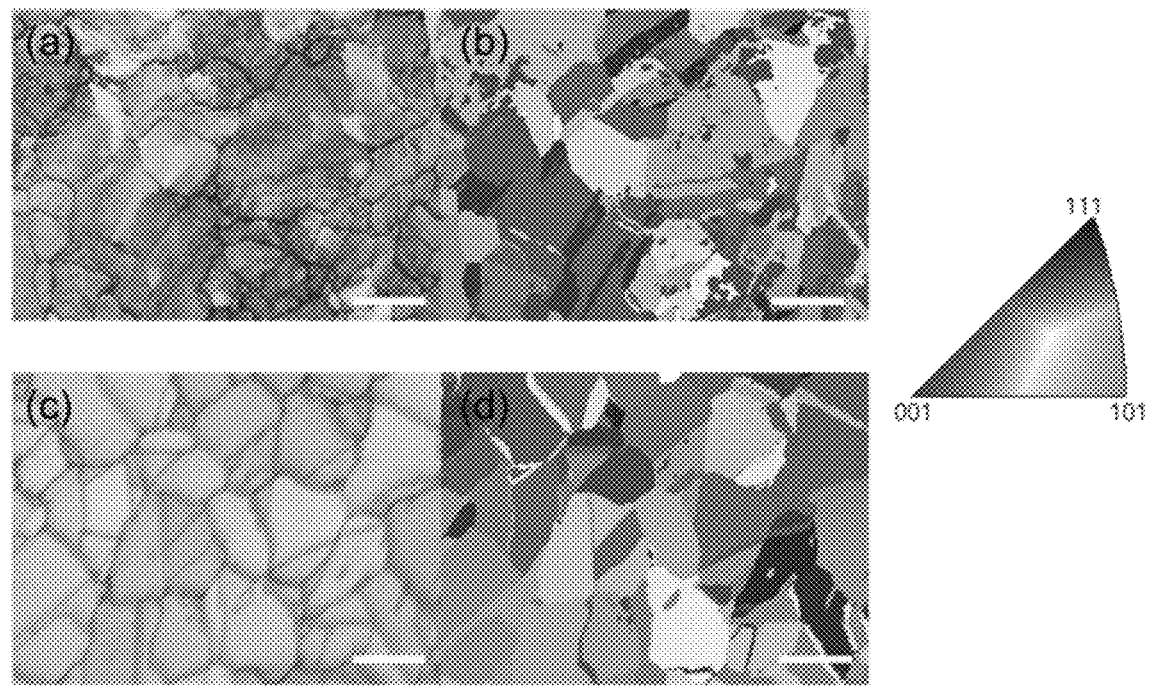

[Figure 4]
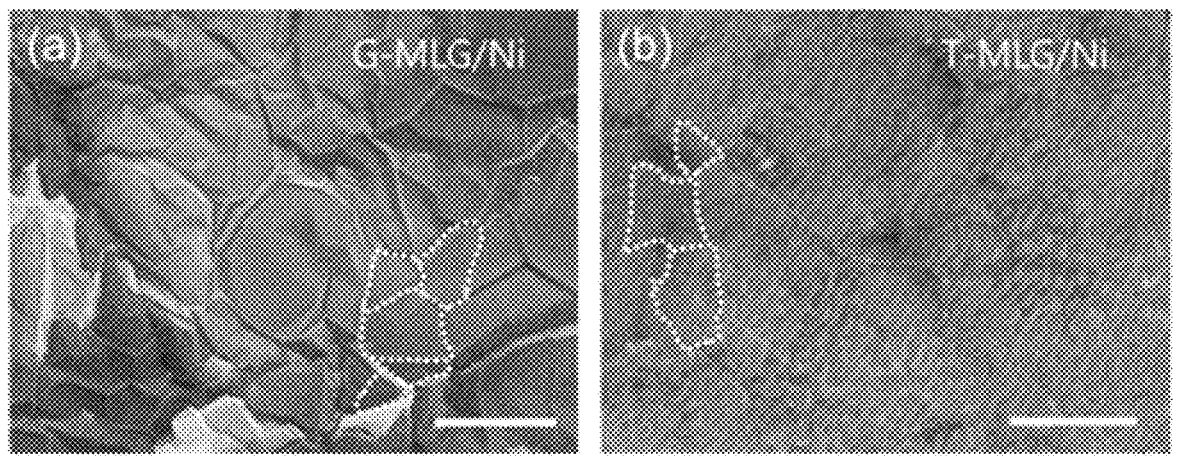

[Figure 5]
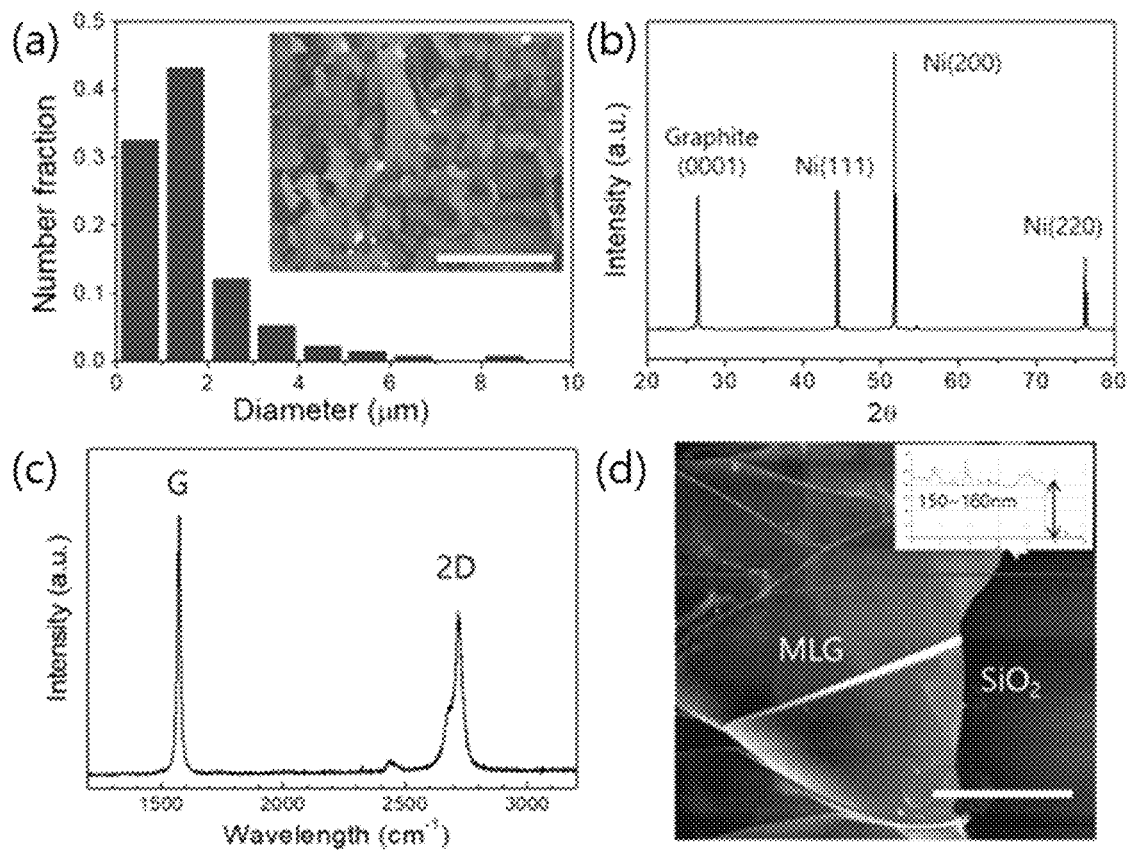

[Figure 6]
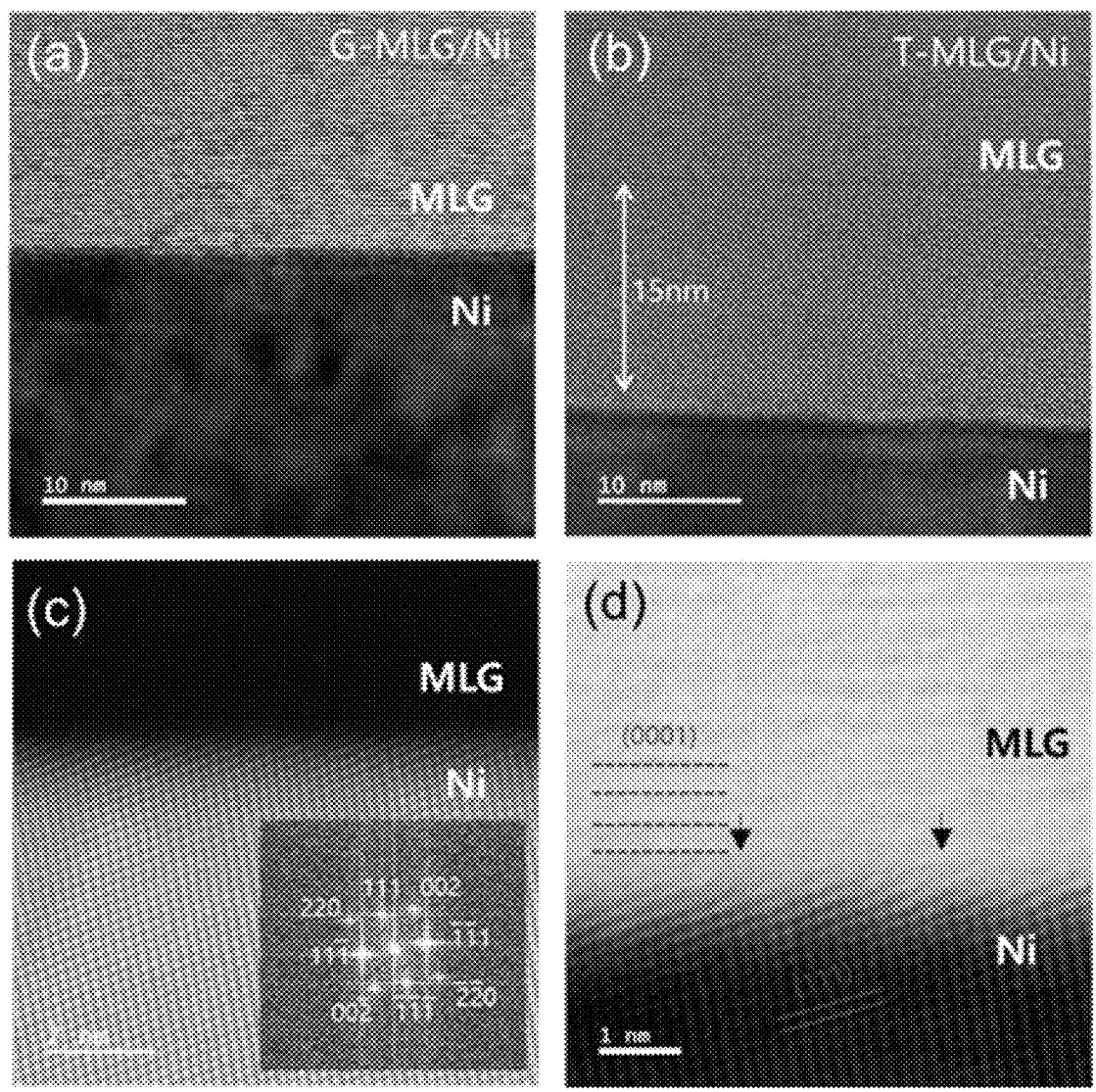

[Figure 7]
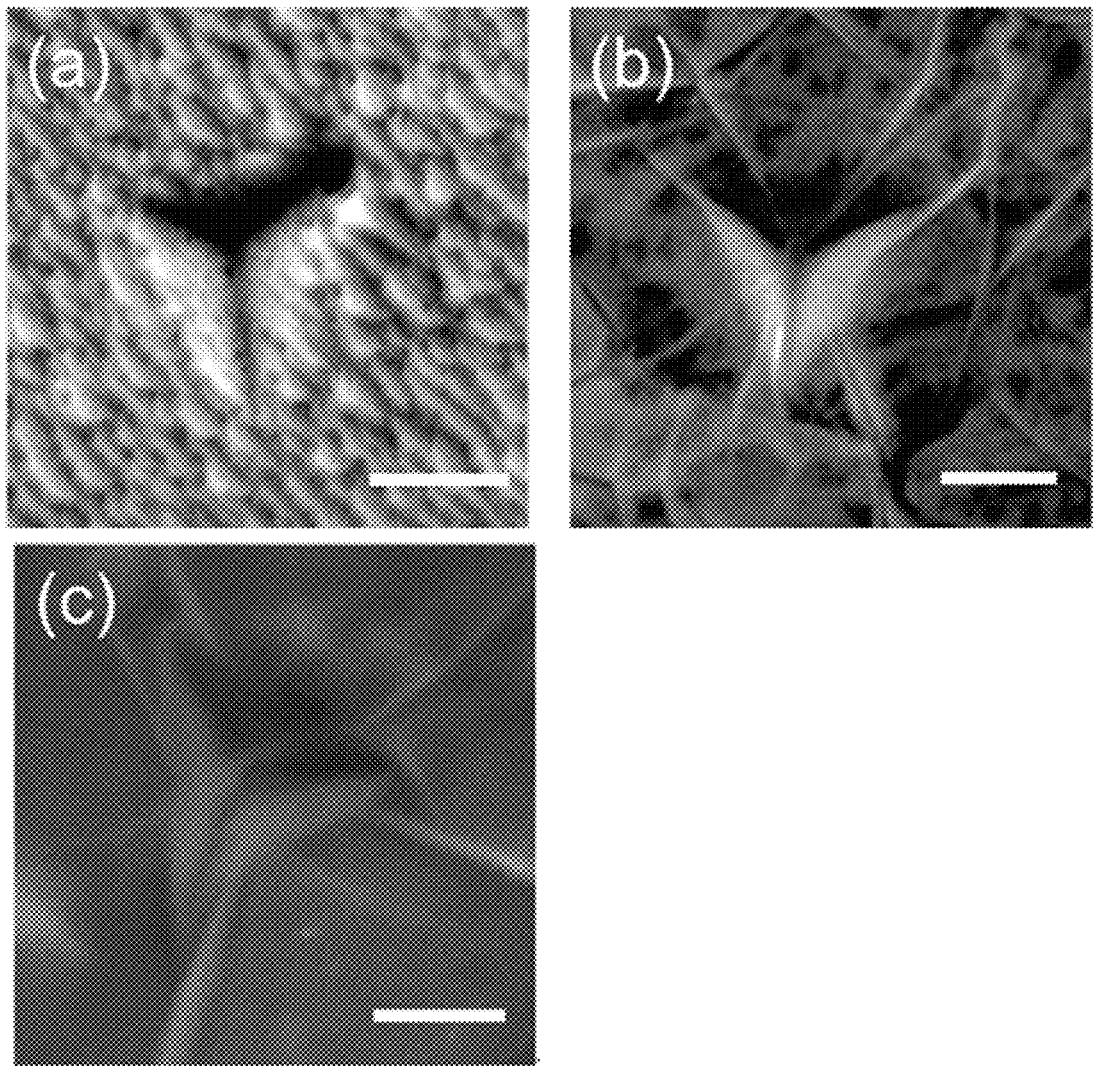

[Figure 8]
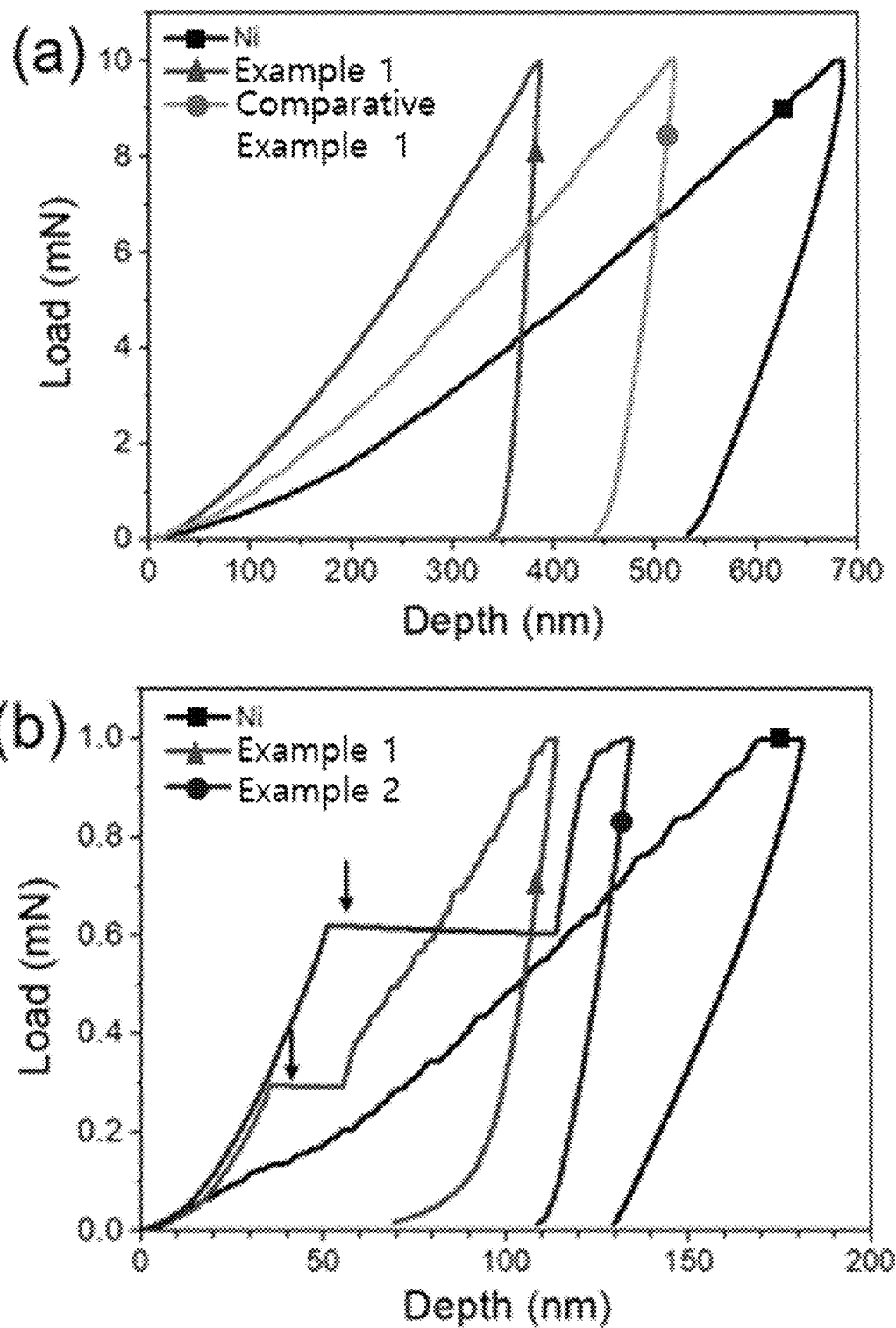

[Figure 9]
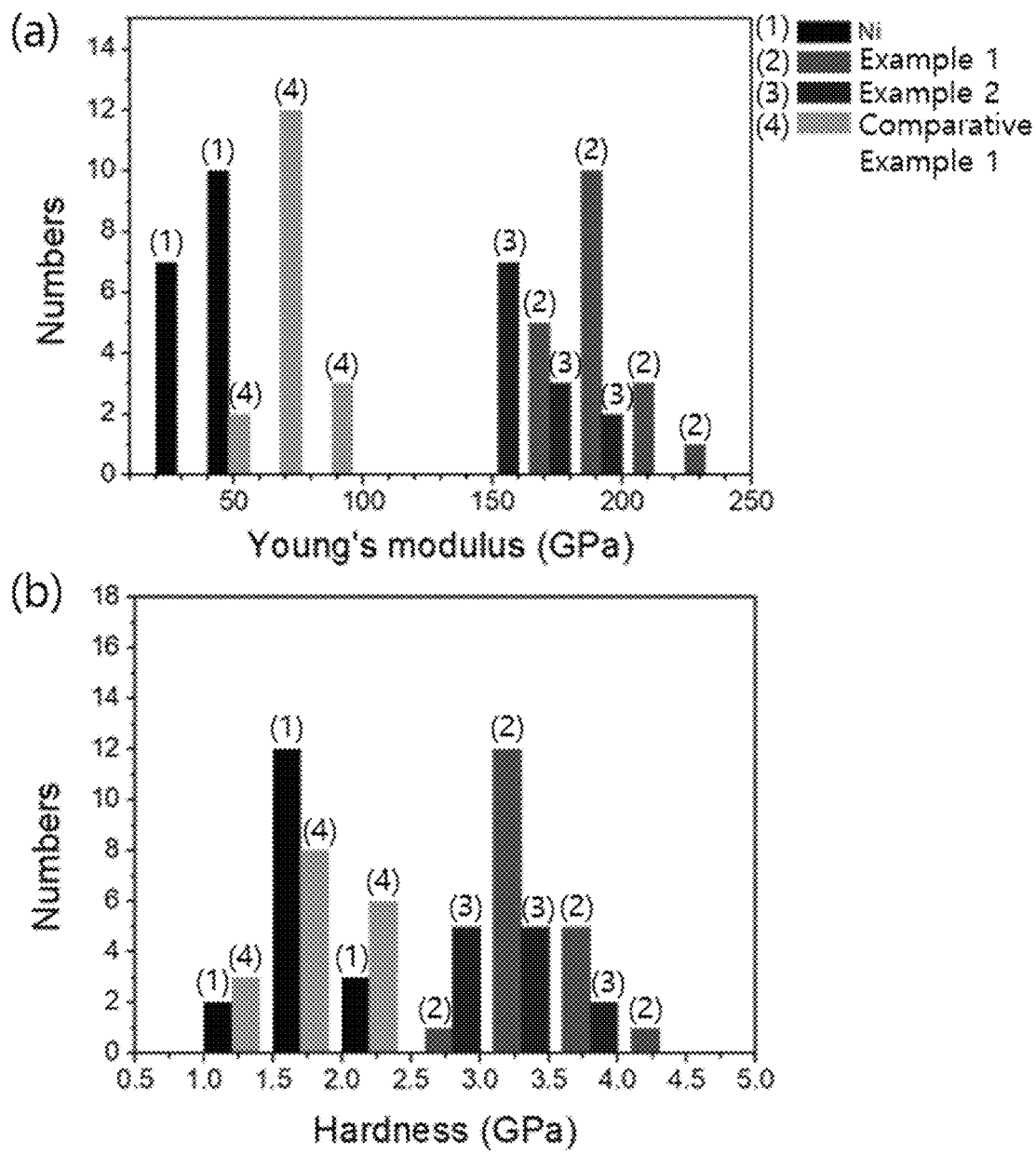

[Figure 10]
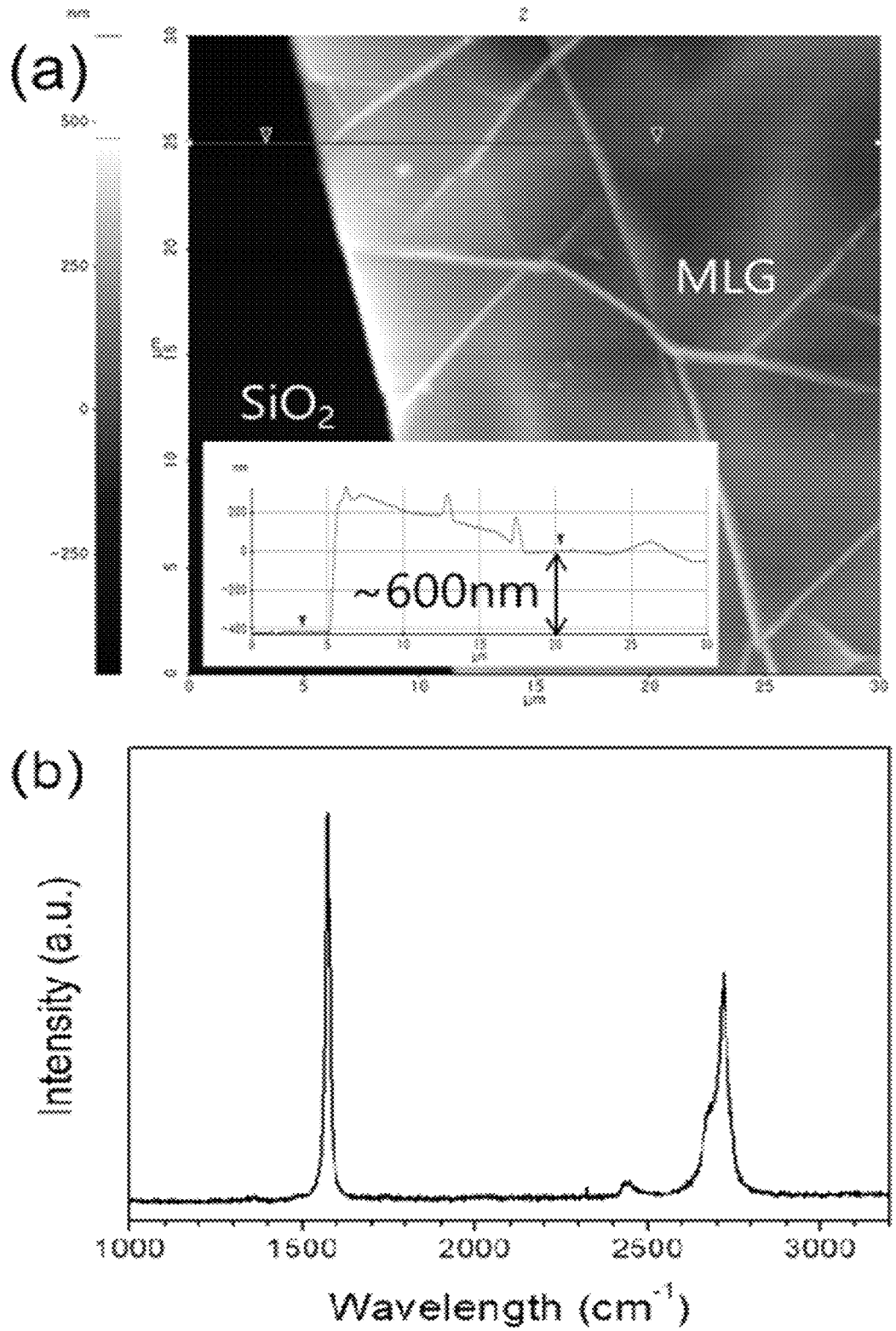

[Figure 11]
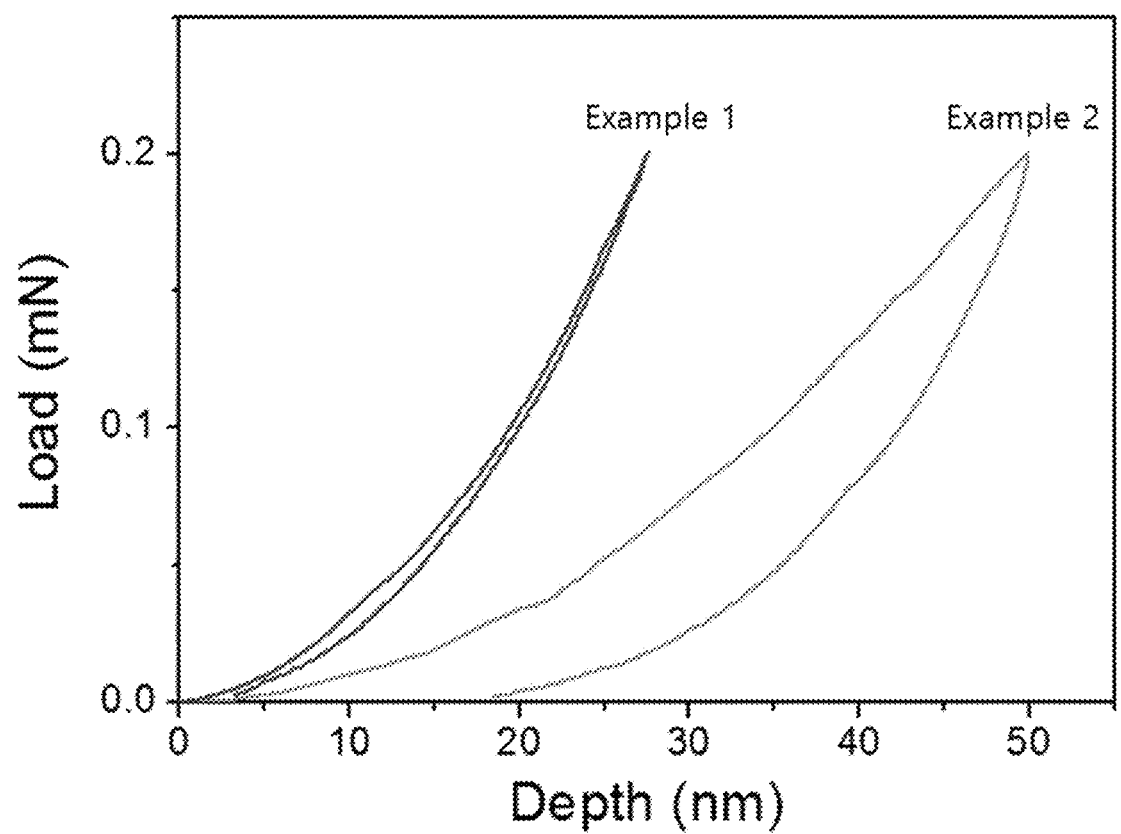

[Figure 12]
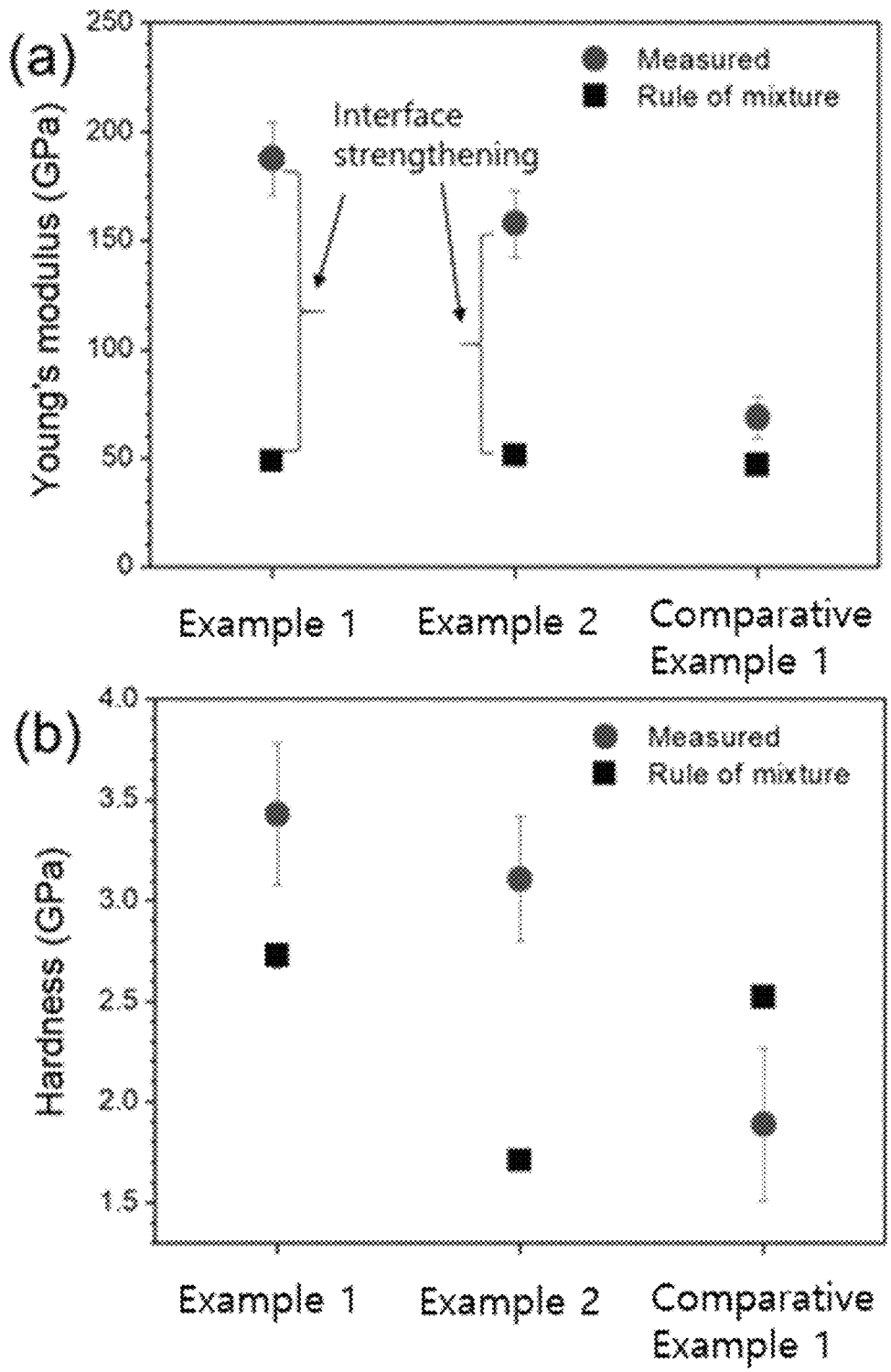

[Figure 13]
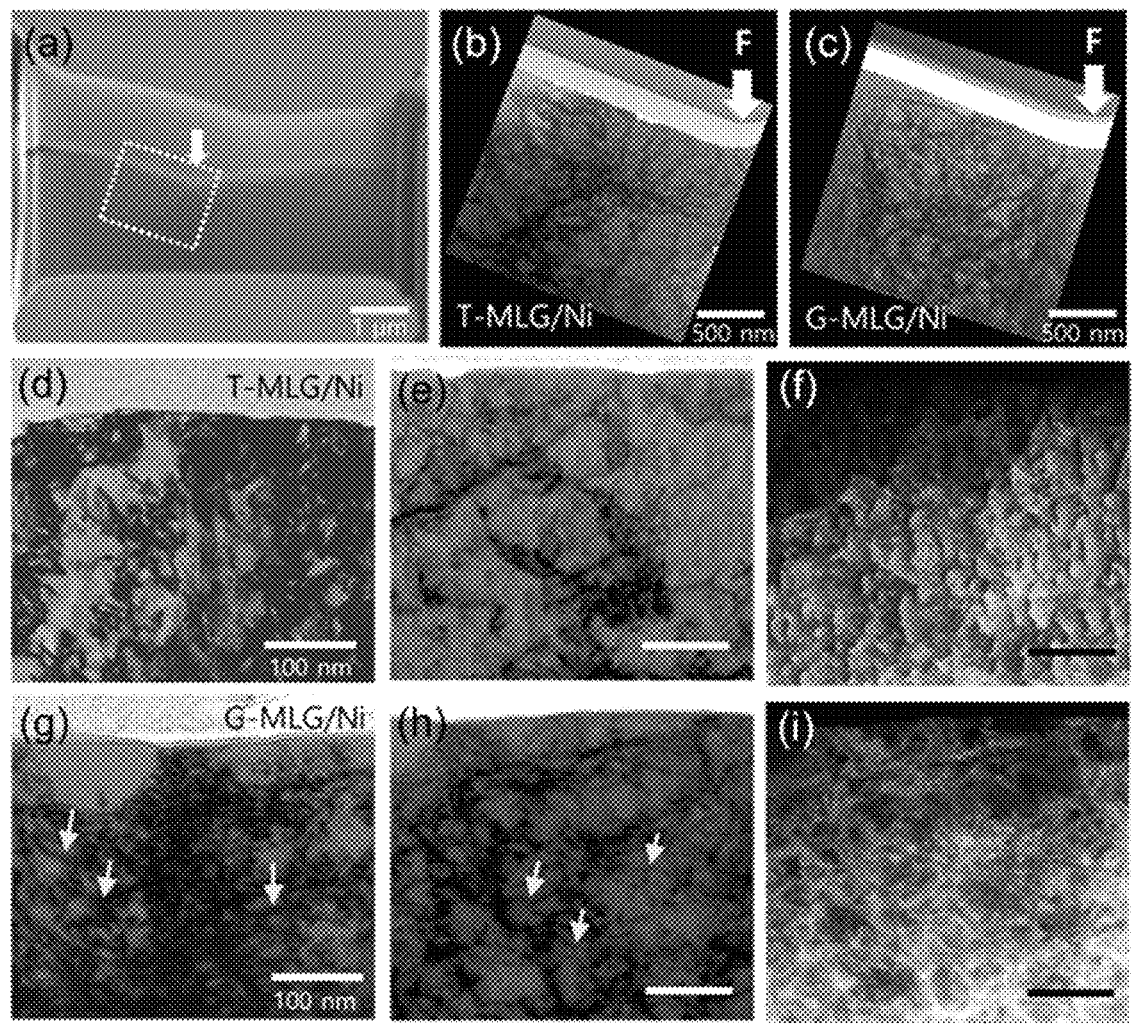

[Figure 14]
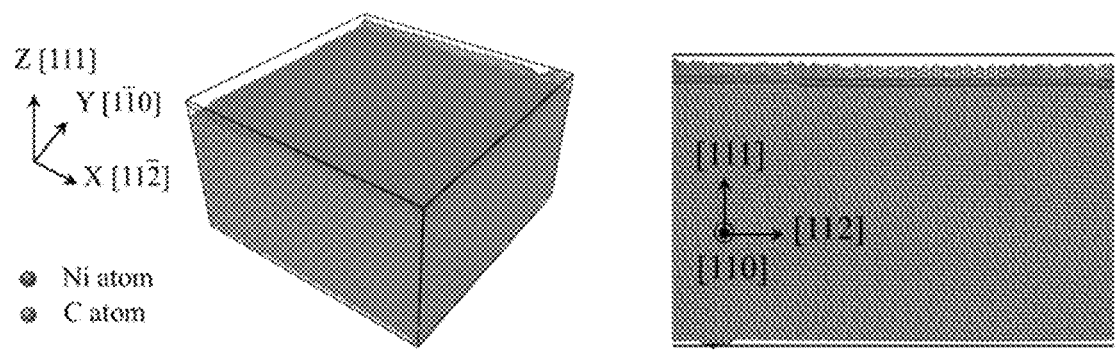

[Figure 15]
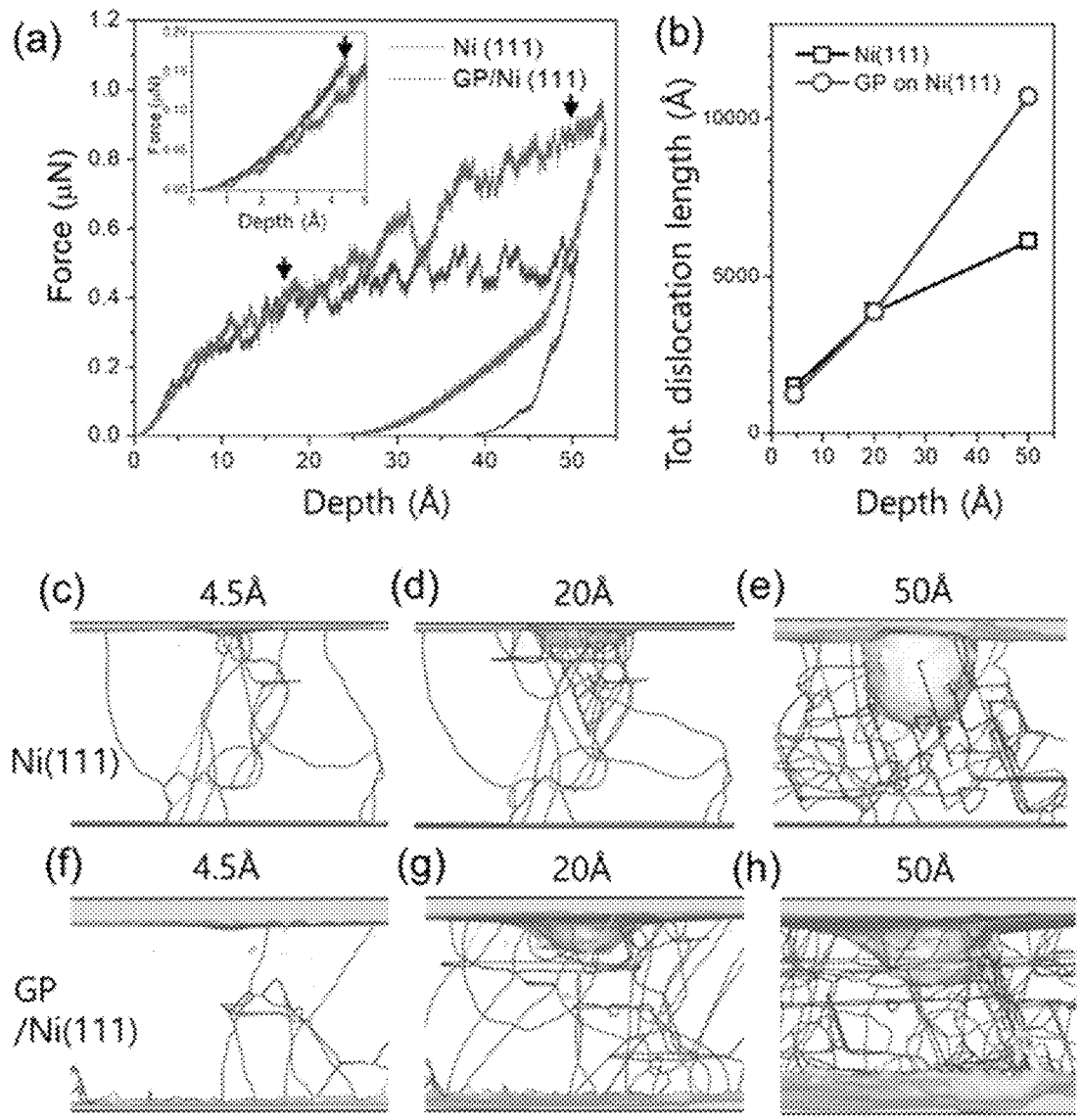

[Figure 16]
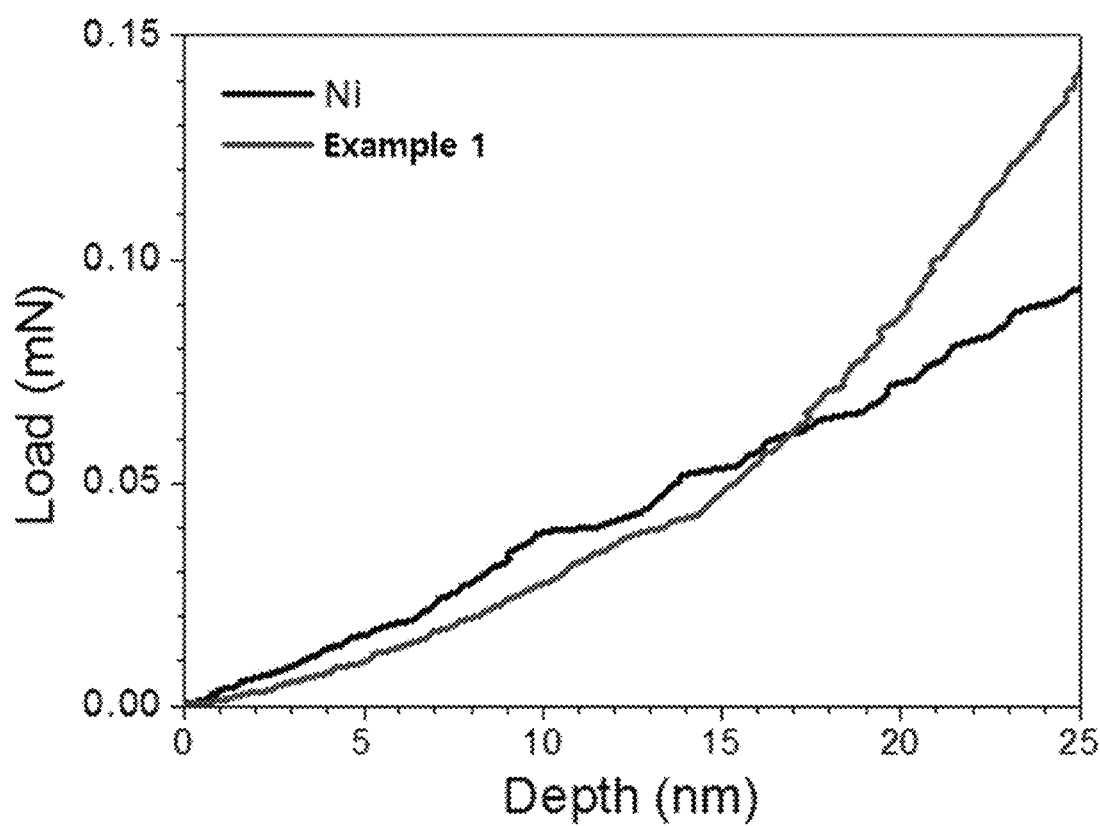

METAL-GRAPHENE COMPOSITE

TECHNICAL FIELD

The present disclosure relates to a metal-graphene composite having excellent mechanical properties.

BACKGROUND ART

A graphene-reinforced metal composite exhibits excellent mechanical properties. Through the powder sintering method, a composite comprising a graphene layer coated on metal is applied as a high-strength thin film in various fields such as micro electro-mechanical systems and flexible electronics due to its excellent mechanical properties.

Due to excellent mechanical properties of the metal-graphene composite, the demand for the metal-graphene composite is increasing in various fields, and research to develop a metal-graphene composite with more improved mechanical properties is in progress.

Accordingly, there is a need for a technology for a metal-graphene composite having excellent mechanical properties such as Young's modulus, hardness, and stiffness.

DISCLOSURE

Technical Problem

A technical problem to be solved by the present disclosure is to provide a metal-graphene composite having excellent mechanical properties.

However, the problem to be solved by the present disclosure is not limited to the above-mentioned problem, and other problems not mentioned herein will be clearly understood by those skilled in the art from the following description.

Technical Solution

An embodiment of the present disclosure provides a metal-graphene composite comprising: a metal layer; and a graphene layer provided by growing directly on one surface of the metal layer, wherein the graphene layer contains two or more graphene thin films.

Advantageous Effects

The metal-graphene composite according to an embodiment of the present disclosure may have excellent mechanical properties.

Effects of the present disclosure are not limited to the above-described effects, and effects not mentioned will be clearly understood by those skilled in the art from the present specification and accompanying drawings.

BRIEF DESCRIPTION OF DRAWINGS

FIG. 1 is images showing a cross section of a metal-graphene composite prepared by growing a graphene layer directly on a metal layer according to an embodiment of the present disclosure, and a cross section of a metal-graphene composite prepared by transferring a graphene layer to a metal layer.

FIG. 2 is a drawing showing processes for preparing metal-graphene composites of Examples 1 and 2 of the present disclosure.

FIG. 3 shows a scanning electron microscope (SEM) image and an electron backscatter diffraction (EBSD)—mapping image of the metal-graphene composite prepared in Example 1 of the present disclosure, and an SEM image and an EBSD mapping image of a nickel foil annealed to 1,000° C. prepared in Comparative Example 1.

FIG. 4 shows an SEM image of the metal-graphene composite prepared in Example 1 of the present disclosure and an SEM image of the metal-graphene composite prepared in Comparative Example 1.

FIG. 5 shows results of measuring various physical properties of the metal-graphene composite prepared in Example 1.

FIG. 6 is images of analyzing cross sections of the metal-graphene composites prepared in Example 1 and Comparative Example 1.

FIG. 7 shows SEM images of indents left by a Berkovich tip in the nickel foil, the metal-graphene composite prepared in Example 1, and the metal-graphene composite prepared in Comparative Example 1.

FIG. 8 shows indentation load-penetration depth curves for the nickel foil, the metal-graphene composite prepared in Example 1, the metal-graphene composite prepared in Example 2, and the metal-graphene composite prepared in Comparative Example 1.

FIG. 9 shows hardness values and Young's modulus values measured for the nickel foil, the metal-graphene composite prepared in Example 1, the metal-graphene composite prepared in Example 2, and the metal-graphene composite prepared in Comparative Example 1.

FIG. 10 shows an atomic force microscope (AFM) image and a Raman spectrum of the metal-graphene composite prepared in Example 2 of the present disclosure.

FIG. 11 shows load-penetration depth curves of a graphene layer prepared in Example 1 and a graphene layer prepared in Example 2.

FIG. 12 shows Young's modulus values and hardness values measured and calculated for the metal-graphene composite prepared in Example 1, the metal-graphene composite prepared in Example 2, and the metal-graphene composite prepared in Comparative Example 1.

FIG. 13 shows cross-sectional transmission electron microscope (TEM) images of the metal-graphene composites prepared in Example 1 and Comparative Example 1 which have been subjected to nanoindentation.

FIG. 14 shows initial configurations of a graphene layer and a metal layer (Ni) in a molecular dynamics simulation.

FIG. 15 shows molecular dynamics simulation results for the metal-graphene composite according to an embodiment of the present disclosure.

FIG. 16 shows load-penetration depth curves for the nickel foil and the metal-graphene composite prepared in Example 1.

BEST MODE

In the present specification, when a part "includes" a certain component, this means that other components may be further included rather than excluding other components unless otherwise stated.

In the present specification, when a member is said to be located "on" another member, this includes not only a case in which a member is in contact with another member but also a case in which another member exists between the two members.

In the present specification, the terms "step to" and "step of . . . " do not mean "step for . . . ".

In the present specification, the term "graphene layer" refers to one in which a graphene in which a plurality of carbon atoms are connected to each other by covalent bonding to form a polycyclic aromatic molecule forms a film or sheet form, and the carbon atoms connected by covalent bonding form a 6-membered ring as a basic repeating unit, but can also further include a 5-membered ring and/or a 7-membered ring. Accordingly, the "graphene layer" is viewed as a single layer of carbon atoms covalently bonded to each other (usually $sp^2$ bond). The "graphene layer" may have various structures, and such structures may vary depending on the content of 5-membered rings and/or 7-membered rings that may be included within graphene. The "graphene layer" may be made of a single layer of graphene as described above, but several layers of graphene may be stacked to form a plurality of layers, and may also be formed to a thickness of up to 100 nm.

Hereinafter, specific contents for carrying out the present disclosure will be described in detail with reference to the accompanying drawings.

An embodiment of the present disclosure provides a metal-graphene composite comprising: a metal layer; and a graphene layer provided by growing directly on one surface of the metal layer, wherein the graphene layer contains two or more graphene thin films.

The metal-graphene composite according to an embodiment of the present disclosure may have excellent mechanical properties. Specifically, the metal-graphene composite may have excellent mechanical properties such as Young's modulus, hardness, and stiffness by comprising a graphene layer formed by growing directly on one surface of the metal layer.

FIG. 1 is images showing a cross section of a metal-graphene composite prepared by growing a graphene layer directly on a metal layer according to an embodiment of the present disclosure, and a cross section of a metal-graphene composite prepared by transferring a graphene layer to a metal layer. Specifically, FIG. 1A schematically shows a metal-graphene composite including a graphene layer GL formed by growing graphene directly on one surface of a metal layer ML. FIG. 1B schematically shows a metal-graphene composite prepared by a method of transferring a prepared graphene layer GL' onto a metal layer ML.

According to an embodiment of the present disclosure, mechanical properties of the metal-graphene composite may be effectively improved by growing a graphene layer containing two or more graphene thin films directly on a metal layer.

Specifically, the metal-graphene composite may have excellent bonding force at the interface between the metal layer and the graphene layer, and the graphene layer may be provided with a uniform thickness on one surface of the metal layer while maintaining excellent quality. Meanwhile, when the metal-graphene composite is prepared by transferring the graphene layer to the metal layer after forming the graphene layer on a catalyst layer and etching the catalyst layer as shown in FIG. 1B, the bonding between the metal layer and the graphene layer is inferior, and the graphene layer is not provided with a uniform thickness on one surface of the metal layer, which causes a problem of inferior mechanical properties.

According to an embodiment of the present disclosure, the metal-graphene composite may have a Young's modulus of 100 GPa or more. Specifically, the metal-graphene composite may have a Young's modulus of 110 GPa or more, 120 GPa or more, 130 GPa or more, 140 GPa or more, 150 GPa or more, 160 GPa or more, 170 GPa or more, 180 GPa or more, or 185 GPa or more. Further, the metal-graphene composite may have a Young's modulus of 250 GPa or less, 230 GPa or less, 200 GPa or less, or 190 GPa or less. In this case, the Young's modulus of the metal-graphene composite may be measured through a method to be described later. The metal-graphene composite having a Young's modulus in the above-described range may have excellent mechanical properties. Accordingly, the metal-graphene composite may be easily used as a reinforcing material in various fields.

According to an embodiment of the present disclosure, the graphene layer itself may have a Young's modulus of 40 GPa or more, 45 GPa or more, 50 GPa or more, 55 GPa or more, or 60 GPa or more. Further, the graphene layer itself may have a Young's modulus of 70 GPa or less, 68 GPa or less, or 66 GPa or less. The metal-graphene composite comprising the graphene layer having a Young's modulus in the above-described range may have excellent mechanical properties.

According to an embodiment of the present disclosure, the metal-graphene composite may have a hardness of 2 GPa or more. Specifically, the metal-graphene composite may have a hardness of 2.3 GPa or more, 2.5 GPa or more, 2.7 GPa or more, 3 GPa or more, 3.1 GPa or more, 3.2 GPa or more, 3.3 GPa or more, or 3.4 GPa or more. Further, the metal-graphene composite may have a hardness of 4 GPa or less, 3.8 GPa or less, 3.6 GPa or less, or 3.5 GPa or less. In this case, the hardness of the metal-graphene composite may be measured through a method to be described later. The metal-graphene composite having a hardness in the above-described range may have excellent mechanical properties. Accordingly, the metal-graphene composite may be easily used as a reinforcing material in various fields.

According to an embodiment of the present disclosure, the graphene layer itself may have a hardness of 1.5 GPa or more, 2 GPa or more, 2.5 GPa or more, 3 GPa or more, 3.5 GPa or more, 4 GPa or more, or 4.2 GPa or more. Further, the graphene layer itself may have a hardness of 6 GPa or less, 5.5 GPa or less, 5 GPa or less, 4.5 GPa or less, or 4.3 GPa or less. The metal-graphene composite comprising the graphene layer having a hardness in the above-described range may have excellent mechanical properties.

According to an embodiment of the present disclosure, the metal-graphene composite may have a stiffness of $2.0 \times 10^{-6}$ N/m or more. Specifically, the metal-graphene composite may have a stiffness of $2.2 \times 10^{-6}$ N/m or more, $2.4 \times 10^{-6}$ N/m or more, $2.6 \times 10^{-6}$ N/m or more, $2.7 \times 10^{-6}$ N/m or more, $2.9 \times 10^{-6}$ N/m or more, or $3.0 \times 10^{-6}$ N/m or more. Further, the metal-graphene composite may have a stiffness of $3.5 \times 10^{-6}$ N/m or less, $3.3 \times 10^{-6}$ N/m or less, or $3.1 \times 10^{-6}$ N/m or less. In this case, the stiffness of the metal-graphene composite may be measured through a method to be described later. The metal-graphene composite having a stiffness in the above-described range may have excellent mechanical properties. Accordingly, the metal-graphene composite may be easily used as a reinforcing material in various fields.

According to an embodiment of the present disclosure, the graphene layer may have a thickness of 100 nm or more and 300 nm or less. Specifically, the graphene layer may have a thickness of 120 nm or more and 280 nm or less, 140 nm or more and 250 nm or less, 160 nm or more and 220 nm or less, 100 nm or more and 200 nm or less, 115 nm or more and 185 nm or less, 130 nm or more and 170 nm or less, 140 nm or more and 160 nm or less, 150 nm or more and 300 nm or less, 160 nm or more and 280 nm or less, 160 nm or more and 240 nm or less, or 180 nm or more and 200 nm or less. When the thickness of the graphene layer is within the above-described range, mechanical properties of the metal-graphene composite such as Young's modulus, hardness, and stiffness may be effectively improved. In particular, when the thickness of the graphene layer is within the above-described range, the graphene layer may effectively maintain excellent bonding force between the metal layer and the interface, and may have excellent thickness uniformity and surface morphologies.

According to an embodiment of the present disclosure, the graphene layer may have a thickness of 500 nm or more. Specifically, the graphene layer may have a thickness of 520 nm or more, 550 nm or more, 580 nm or more, or 600 nm or more. Further, the graphene layer may have a thickness of 750 nm or less, 700 nm or less, 650 nm or less, or 600 nm or less. The metal-graphene composite comprising the graphene layer having a thickness in the above-described range may have excellent mechanical properties such as Young's modulus, hardness, and stiffness.

According to an embodiment of the present disclosure, the metal layer may contain at least one of copper (Cu), nickel (Ni), cobalt (Co), iron (Fe), manganese (Mn), chromium (Cr), vanadium (V), titanium (Ti), platinum (Pt), gold (Au), aluminum (Al), magnesium (Mg), rhodium (Rh), tungsten (W), zirconium (Zr), and tantalum (Ta). Specifically, the metal layer may contain at least one of copper and nickel. By using the above-described type of metal layer, it is possible to effectively grow the graphene layer on the metal layer, and further improve the mechanical properties of the metal-graphene composite.

According to an embodiment of the present disclosure, the metal layer may have a thickness of 10 μm or more. Specifically, the metal layer may have a thickness of 15 μm or more, 20 μm or more, 25 μm or more, or 30 μm or more. Further, the metal layer may have a thickness of 50 μm or less, 45 μm or less, 40 μm or less, 35 μm or less, or 30 μm or less. When the thickness of the metal layer is within the above-described range, Young's modulus, hardness, and stiffness of the metal-graphene composite may be effectively improved, and deterioration of the interfacial bonding force between the metal layer and the graphene layer may be suppressed.

According to an embodiment of the present disclosure, the metal layer and the graphene layer may have a thickness ratio of 1:0.005 to 1:0.05. Specifically, the metal layer and the graphene layer may have a thickness ratio of 1:0.005 to 1:0.02. Further, the metal layer and the graphene layer may have a thickness ratio of 1:0.025 to 1:0.035. When the thickness ratio of the metal layer and the graphene layer is within the above-described range, Young's modulus, hardness, and stiffness of the metal-graphene composite may be effectively improved, and the interfacial bonding force between the metal layer and the graphene layer may be effectively improved.

According to an embodiment of the present disclosure, the graphene layer may contain two or more graphene thin films. Specifically, the graphene layer may contain a plurality of graphene thin films so as to have the above-described thickness range. For example, a graphene layer having a thickness of 100 nm or more and 300 nm or less may contain 300 to 1,000 graphene thin films, and a graphene layer having a thickness of 500 nm or more and 750 nm or less may contain 1,500 to 2,500 graphene thin films. The graphene layer may contain 2 to 10, 2 to 8, 2 to 6, 2 to 4, or 2 to 3 graphene thin films. The metal-graphene composite in which the graphene layer containing the graphene thin films in the above-described range is formed directly on the metal layer may have excellent mechanical properties.

According to an embodiment of the present disclosure, the graphene thin films may each contain single-crystalline graphite grains each having a diameter of 10 μm or less. Specifically, two or more graphene thin films contained in the graphene layer may each contain single-crystalline graphite grains each having a diameter of 10 μm or less. More specifically, the single-crystalline graphite grains contained in the graphene thin films may each have a diameter of 1 μm or more and 10 μm or less, 1 μm or more and 8 μm or less, 1 μm or more and 6 μm or less, 1 μm or more and 4 μm or less, or 1 μm or more and 2 μm or less. When the diameter of each of the single-crystalline graphite grains contained in the graphene thin films is within the above-described range, the graphene layer may have excellent quality and surface morphologies, which makes it possible to effectively improve the mechanical properties of the metal-graphene composite.

According to an embodiment of the present disclosure, the graphene thin films may contain grains oriented in the vertical direction along a plane [0001]. As shown in FIG. 5 to be described later, the graphene thin films contain grains oriented in the vertical direction along the plane [0001], which may enable excellent quality and crystallinity of the graphene layer. Through this, mechanical properties of the metal-graphene composite comprising the graphene layer such as Young's modulus, hardness, and stiffness may be effectively improved.

According to an embodiment of the present disclosure, the graphene layer may be one in which a D peak of 1,350 $cm^{-1}$ is not observed in the Raman spectrum. As shown in FIG. 5 to be described later, the graphene layer may have excellent crystallinity so that the D peak of 1,350 $cm^{-1}$ may not be observed in the Raman spectrum. The metal-graphene composite may have excellent mechanical properties such as Young's modulus, hardness, and stiffness by comprising the graphene layer having excellent crystallinity.

According to an embodiment of the present disclosure, the distance between the metal layer and the graphene thin film adjacent to the metal layer along a thickness direction may be smaller than the distance between the graphene thin films contained in the graphene layer. For example, when the metal-graphene composite comprises a metal layer, a first graphene thin film grown on one surface of the metal layer, a second graphene thin film grown on the first graphene thin film, and a third graphene thin film grown on the second graphene thin film, the distance between the metal layer and the first graphene thin film may be smaller than the distance between the first graphene thin film and the second graphene thin film or the distance between the second graphene thin film and the third graphene thin film. That is, in the metal-graphene composite, the interfacial bonding force between the metal layer and the graphene thin film closest thereto may be excellent. As described above, the interfacial bonding force between the metal layer and the graphene thin film closest thereto may be excellent, and thus mechanical properties of the metal-graphene composite such as Young's modulus, hardness, and stiffness may be effectively improved.

According to an embodiment of the present disclosure, in the metal-graphene composite, the metal layer and the graphene thin film adjacent to the metal layer may include a continuous bonding along a planar direction parallel to one surface of the metal layer. That is, as the metal layer and the graphene thin film adjacent to the metal layer are continuously bonded in the planar direction, the interfacial bonding force between the metal layer and the graphene layer may be effectively improved.

According to an embodiment of the present disclosure, the graphene layer may be grown and prepared on the metal layer using a roll-to-roll process. Specifically, the graphene layer may be grown on the metal layer by using a roll-to-roll process using a chemical vapor deposition (CVD) method. As a method of forming a graphene layer on the metal layer, a method of synthesizing graphene in the art may be adopted and used without limitation. For example, graphene may be synthesized on the metal layer by supplying hydrogen gas and a carbonization source onto a heated metal layer. The carbonization source may include at least one of carbon monoxide, carbon dioxide, methane, ethane, ethylene, ethanol, acetylene, propane, butane, butadiene, pentane, pentene, cyclopentadiene, hexane, cyclohexane, benzene, and toluene, but the type of the carbonization source is not limited thereto.

According to an embodiment of the present disclosure, the chemical vapor deposition method may be performed at a temperature of 700° C. or higher. Specifically, the chemical vapor deposition method may be performed at a temperature of 750° C. or higher, 800° C. or higher, 850° C. or higher, 900° C. or higher, or 1,000° C. or higher. Further, the chemical vapor deposition method may be performed a temperature of 2,000° C. or lower, 1, 900° C. or lower, 1,800° C. or lower, 1,700° C. or lower, 1,600° C. or lower, or 1,500° C. or lower. The temperature at which the chemical vapor deposition method is performed may be set depending on the type of material forming the metal layer. Specifically, the temperature may be set in consideration of the melting point of the material forming the metal layer. For example, when the metal layer is formed using copper, the chemical vapor deposition method may be performed at a temperature of 1,000° C. or higher and 1,085° C. or lower. Further, when the metal layer is formed using nickel, the chemical vapor deposition method may be performed at a temperature of 750° C. or higher and 1,100° C. or lower. Further, when the metal layer is formed using palladium, the chemical vapor deposition method may be performed at a temperature of 950° C. or higher and 1,050° C. or lower.

When the temperature at which the chemical vapor deposition method is performed is within the above-described range, the graphene layer may be stably formed on the metal layer, and graphene synthesized may have excellent crystallinity. That is, the temperature at which the chemical vapor deposition method is performed may be set in consideration of the melting point of the material used to form the metal layer, which makes it possible to stably form the graphene layer on the metal layer, and further improve the crystallinity of graphene synthesized.

Hereinafter, Examples will be given and described in detail in order to specifically describe the present disclosure. However, the embodiments according to the present disclosure may be modified in various other forms, and the scope of the present disclosure is not to be construed as being limited to the Examples described below. The Examples of the present specification are provided to more completely explain the present disclosure to those of ordinary skill in the art.

Example 1

FIG. 2 is a drawing showing processes for preparing metal-graphene composites of Examples 1 and 2 of the present disclosure.

A roll-to-roll CVD system (graphene square) based on a quartz tube having a diameter of 200 mm and a length of 800 mm was used in order to form graphene on the metal layer. An unpretreated nickel foil (Ulbrich Stainless Steels Special Metals, Inc.) having a thickness of 20 μm and a purity of 99.9% was prepared as a metal layer.

After the CVD system was pumped at a basic pressure of $10^{-3}$ Torr, the CVD system was purged using $H_2$ gas (20 sccm), and In this case, it was heated to 1,000° C. at a heating rate of 195° C./min using a halogen lamp. After the CVD system reached a temperature of 1,000° C., the nickel foil was annealed for 8 minutes under the condition that $H_2$ gas (6.25 sccm) was supplied. Thereafter, a total of 3 cycles were performed by a method of performing 1 cycle for 8 minutes by simultaneously introducing $H_2$ gas (6.25 sccm) and $CH_4$ gas (500 sccm) into the chamber while the temperature of 1,000° C. was maintained. Through this, a metal-graphene composite was prepared by growing a graphene layer, containing about 470-layered graphene thin films and having a thickness of about 160 nm, directly on one surface of the nickel foil (metal layer).

Example 2

A metal-graphene composite was prepared by growing a graphene layer, containing about 1,760-layered graphene thin films and having a thickness of about 600 nm, directly on one surface of the nickel foil (metal layer) in the same manner as in Example 1, except that, in Example 1, $CH_4$ gas was supplied at 400 sccm when the first cycle was performed, and $CH_4$ gas was supplied at 800 sccm when the second cycle and the third cycle were performed.

Comparative Example 1

A graphene layer having a thickness of about 160 nm was formed on one surface of the nickel foil (metal layer) in the same manner as in Example 1.

Thereafter, the nickel foil was wet-etched using an $FeCl_3$ solution diluted to a concentration of 10% with distilled water at room temperature, subjected to a rinsing process with distilled water for 1 hour, and then dried for 3 hours to complete the wet etching process. After the wet etching process was completed, a 160 nm-thick graphene layer was transferred onto one surface of a new nickel foil annealed to 1,000° C. After the transfer was completed, the graphene layer transferred onto the nickel foil was placed on a hot plate heated to 90° C. and dried for about 1 hour to remove moisture between the graphene layer and the nickel foil, thereby preparing a metal-graphene composite.

FIG. 3 shows a scanning electron microscope (SEM) image and an electron backscatter diffraction (EBSD)—mapping image of the metal-graphene composite prepared in Example 1 of the present disclosure, and an SEM image and an EBSD mapping image of the nickel foil annealed to 1,000° C. prepared in Comparative Example 1.

Specifically, FIG. 3A is a scanning electron microscope (SEM) image of the metal-graphene composite prepared in Example 1, and FIG. 3B is a mapping image of electron backscatter diffraction (EBSD) of the crystal orientation of the nickel foil in the metal-graphene composite prepared in Example 1. FIGS. 3C and 3D are respectively an SEM image and an EBSD mapping image of the nickel foil annealed to 1,000° C. and prepared in Comparative Example 1. In FIG. 3, the scale bar has a length of 10 μm.

In order to make the microstructure of nickel in the metal-graphene composite prepared in Comparative Example 1 to become similar to the microstructure of nickel in the metal-graphene composite prepared in Example 1, the nickel foil to which the graphene layer was to be transferred in Comparative Example 1 was annealed to 1,000° C.

Experimental Example

The physical properties of the prepared metal-graphene composites were observed and evaluated using the following experimental equipment.
SEM: JSM-7600F; JEOL Ltd.
TEM/STEM: JEM-ARM200F; JEOL Ltd.
XRD: performed with Cu Kα radiation at room temperature; Smart Lab, Rigaku
Raman: Micro-Raman spectroscopy measurement (inVia confocal Raman microscope, Renishaw) was used, and samples were excited with an $Ar^+$ laser (spot size of 1 μm) having an excitation power of 120 mW at a wavelength of 514 nm.
Measurement of mechanical properties: The mechanical properties of the metal-graphene composites were measured using a nanoindenter (Nano AIS, Frontics) provided with a Berkovich indenter. 10 mN was applied as a maximum load, and the loading and unloading rates were set to 0.3 $mNs^{-1}$. A dwell time of 1 second at the maximum load was allowed. Indentation was performed on the samples at dozens of different points, and Young's modulus and hardness of the samples were obtained from load-penetration depth curves.
MD simulation (molecular dynamics simulation): The simulation system was set up to consist of a graphene layer disposed parallel to the surface of a single-crystalline nickel block. The nickel block has a (111) surface with a size of 20×20 nmz and a depth of 10 nm.

Interactions between nickel (Ni) atoms are explained by an embedded atom-method interaction potential, and carbon (C) atoms are determined according to an adaptive intermolecular reactive empirical bond order (AIREBO) potential. Finally, the interaction between carbon and nickel is explained through a pairwise Lennard-Jones potential of depth ($\varepsilon$=23.049 mV) and length parameters ($\sigma$=2.852 Å). The indenter adopted for the simulation has a radius (R) of nm, and this radius moves to a final depth of 5 nm perpendicularly to the surface.

FIG. 4 shows an SEM image of the metal-graphene composite prepared in Example 1 of the present disclosure and an SEM image of the metal-graphene composite prepared in Comparative Example 1. Specifically, FIG. 4A is an SEM image of the metal-graphene composite prepared in Example 1 of the present disclosure, and FIG. 4B is an SEM image of the metal-graphene composite prepared in Comparative Example 1. In FIG. 4, the scale bar has a length of 10 μm, and the white dotted line indicates the grain boundary of the graphene layer.

Referring to FIG. 4, the surface morphologies of the metal-graphene composites prepared in Example 1 and Comparative Example 1 can be confirmed. Specifically, it was confirmed that graphite grains each having a size of several micrometers were present on the surface of the metal-graphene composites prepared in Example 1 and Comparative Example 1.

FIG. 5 shows results of measuring various physical properties of the metal-graphene composite prepared in Example 1. Specifically, FIG. 5A shows a histogram of the crystal size of the graphene layer based on the EBSD mapping image of the metal-graphene composite prepared in Example 1. FIG. 5B shows an X-ray diffraction (XRD) spectrum of the metal-graphene composite prepared in Example 1. FIG. 5C shows a Raman spectrum of the metal-graphene composite prepared in Example 1. FIG. 5D is an image observed using an atomic force microscope (AFM) after etching the nickel foil in the metal-graphene composite prepared in Example 1 and then transferring the graphene layer to $SiO_2$. In FIG. 5, the scale bar has a length of 10 μm.

Referring to FIGS. 3 and 5A, it was confirmed that the graphene layer grown on the nickel foil in the metal-graphene composite prepared in Example 1 was composed of single-crystalline graphite grains each having a diameter of about 1 to 2 μm, and the nickel foil was composed of crystals exceeding 10 μm in diameter.

Through FIG. 3 and FIGS. 5A and 5B, it was confirmed that the graphene layer was composed of grains oriented in the vertical direction along the plane [0001], and the nickel foil had a textured structure in which the grains are mixed along a plane [100], a plane [110], and a plane [111].

Referring to FIG. 5C, in the graphene layer of the metal-graphene composite prepared in Example 1, a high-intensity G peak (to 1580 $cm^{-1}$) and a 2D peak (to 2700 $cm^{-1}$) were observed, but a D peak (1350 $cm^{-1}$) was not observed. Through this, it was confirmed that the graphene layer had excellent crystallinity.

After the nickel foil in the metal-graphene composite prepared in Example 1 was etched, the graphene layer was transferred to $SiO^2$ and an AFM image was obtained. Referring to FIG. 5D, it was confirmed that the graphene layer prepared in Example 1 had a uniform morphology.

FIG. 6 is images of analyzing cross sections of the metal-graphene composites prepared in Example 1 and Comparative Example 1. Specifically, FIG. 6A is a TEM image showing an interfacial structure between the metal layer and graphene layer of the metal-graphene composite prepared in Example 1, and FIG. 6B is a TEM image showing an interfacial structure between the metal layer and graphene layer of the metal-graphene composite prepared in Comparative Example 1. FIGS. 6C and 6D are STEM images of the metal-graphene composite prepared in Example 1. In FIG. 6C, a fast Fourier transform (FFT) pattern of an STEM image of nickel is inserted.

Referring to FIG. 6A, it was confirmed that atoms are continuously connected at an interface between the metal layer (Ni) and the graphene layer (MLG) in the metal-graphene composite (G-MLG/Ni) prepared in Example 1. On the other hand, referring to FIG. 6B, it was confirmed that the metal-graphene composite (T-MLG/Ni) prepared in Comparative Example 1 had a gap of about 15 nm at the interface between the metal layer (Ni) and the graphene layer (MLG).

Referring to FIGS. 6C and 6D, the plane [0001] of the graphene layer parallel to the well-aligned nickel atoms is clearly shown. In addition, referring to the FFT pattern inserted in FIG. 6C, it was confirmed that the crystal plane direction of nickel parallel to the graphene layer [0001] was close to (111).

Referring to FIG. 6D, it was confirmed in the case of the metal-graphene composite prepared in Example 1 that the distance (indicated by a black arrow) between the metal layer (Ni) and the graphene thin film closest thereto was shorter than the distance between the graphene thin films contained in the graphene layer. This means that a strong bond exists between the metal layer and the graphene thin film closest thereto. Meanwhile, it was confirmed in the case of the metal-graphene composite prepared in Comparative Example 1 that a bond did not exist between the metal layer and the graphene thin film closest thereto.

The mechanical properties of the nickel foil, the metal-graphene composite prepared in Example 1, and the metal-graphene composite prepared in Comparative Example 1 were measured through a nanoindentation method using a Berkovich tip composed of a three-sided pyramidal diamond tip.

FIG. 7 shows SEM images of indents left by a Berkovich tip in the nickel foil, the metal-graphene composite prepared in Example 1, and the metal-graphene composite prepared in Comparative Example 1. Specifically, FIG. 7A shows an SEM image of the indent left by the Berkovich tip in the nickel foil prepared in Example 1, FIG. 7B shows an SEM image of the indent left by the Berkovich tip in the metal-graphene composite prepared in Example 1, and FIG. 7C shows an SEM image of the indent left by the Berkovich tip in the metal-graphene composite prepared in Comparative Example 1. In FIG. 7, the scale bar has a length of 2 μm.

Nanoindentation is a well-known multipurpose technique that can be used to study the mechanical properties of thin films and to make accurate measurements at the nanoscale.

FIG. 8 shows indentation load-penetration depth curves for the nickel foil, the metal-graphene composite prepared in Example 1, the metal-graphene composite prepared in Example 2, and the metal-graphene composite prepared in Comparative Example 1. Specifically, FIG. 8A shows indentation load-penetration depth curves for the nickel foil (Ni) prepared in Example 1, the metal-graphene composite prepared in Example 1, and the metal-graphene composite prepared in Comparative Example 1 at a maximum load of 10 mN, and FIG. 8B shows indentation load-penetration depth curves for the nickel foil (Ni) prepared in Example 1, the metal-graphene composite prepared in Example 1, and the metal-graphene composite prepared in Example 2 at a maximum load of 1 mN.

The mechanical properties of all samples were measured under a load of 10 mN. First, the stiffness values of the samples were determined based on the slopes of the load-penetration depth curves in the unloading process, and the results are shown in Table 1 below. Referring to Table 1, it was confirmed that the metal-graphene composites prepared in Examples 1 and 2 had excellent stiffness about 3 times the nickel foil.

Further, hardness values and Young's modulus values of the samples were calculated through the Oliver Pharr method using load-penetration depth curves. For the statistical analysis, 20 load-penetration depth curves were collected for different locations per sample.

FIG. 9 shows hardness values and Young's modulus values measured for the nickel foil, the metal-graphene composite prepared in Example 1, the metal-graphene composite prepared in Example 2, and the metal-graphene composite prepared in Comparative Example 1. Specifically, FIG. 9 shows average values and distributions for the measured hardness values and Young's modulus values.

Comparisons of the measured hardness values and Young's modulus values of the samples are shown in Table 1 below. Referring to FIG. 9 and Table 1, it was confirmed that the metal-graphene composite prepared in Example 1 had hardness about 2 times and Young's modulus about 5 times the nickel foil.

TABLE 1

| | Stiffness (N/m) | Young's modulus (GPa) | Hardness (GPa) |
|---|---|---|---|
| Nickel foil | $1.00 \times 10^{-6}$ | 40.35 ± 3.70 | 1.76 ± 0.30 |
| Example 1 | $3.09 \times 10^{-6}$ | 187.86 ± 16.72 | 3.43 ± 0.35 |
| Comparative | $1.82 \times 10^{-6}$ | 60.82 ± 9.61 | 1.89 ± 0.38 |

TABLE 1-continued

| | Stiffness (N/m) | Young's modulus (GPa) | Hardness (GPa) |
|---|---|---|---|
| Example 1 | | | |
| Example 2 | $2.74 \times 10^{-6}$ | 157.85 ± 15.05 | 3.11 ± 0.31 |

FIG. 10 shows an atomic force microscope (AFM) image and a Raman spectrum of the metal-graphene composite prepared in Example 2 of the present disclosure. Specifically, FIG. 10A is an image observed using an atomic force microscope (AFM) after etching a nickel foil in the metal-graphene composite prepared in Example 2 and then transferring a graphene layer to $SiO_2$, and FIG. 10B shows a Raman spectrum.

FIG. 11 shows load-penetration depth curves of the graphene layer prepared in Example 1 and the graphene layer prepared in Example 2. Specifically, FIG. 11 shows a load-penetration depth curve for the graphene layer itself having a thickness of 160 nm and prepared in Example 1 and a load-penetration depth curve for the graphene layer itself having a thickness of 600 nm and prepared in Example 2.

Table 2 below shows Young's modulus values and hardness values of the graphene layer prepared in Example 1 and the graphene layer prepared in Example 2, the Young's modulus values and hardness values being derived through the load-penetration depth curves shown in FIG. 11.

TABLE 2

| | Young's modulus (GPa) | Hardness (GPa) |
|---|---|---|
| Example 1 | 62.049 | 4.219 |
| Example 2 | 51.732 | 1.708 |

Referring to FIGS. 8 to 11, and Tables 1 and 2, it was confirmed that the metal-graphene composite prepared in Example 1 had larger stiffness, Young's modulus, and hardness values than those of the metal-graphene composite prepared in Example 2. Further, it was confirmed that the 160 nm-thick graphene layer of Example 1 had relatively excellent mechanical properties compared to the 600 nm-thick graphene layer of Example 2. Further, referring to FIG. 8B, it was confirmed that the graphene layer of Example 2 had a partial fracture in the portion indicated by the arrow.

FIG. 12 shows Young's modulus values and hardness values measured and calculated for the metal-graphene composite prepared in Example 1, the metal-graphene composite prepared in Example 2, and the metal-graphene composite prepared in Comparative Example 1. Specifically, FIG. 12A shows Young's modulus values measured through the nanoindentation experiment and Young's modulus values calculated by the rule of mixture with respect to the metal-graphene composites prepared in Examples 1 and 2, and Comparative Example 1. FIG. 12B shows hardness values measured through the nanoindentation experiment and hardness values calculated by the rule of mixture with respect to the metal-graphene composites prepared in Examples 1 and 2, and Comparative Example 1.

Young's modulus values of the samples were calculated through the rule of mixture according to Equation 1 below, and hardness values were calculated through the rule of mixture according to Equation 1 below.

$$E_{MLG/Ni} = V_{MLG}E_{MLG} + V_{Ni}E_{Ni} \qquad \text{[Equation 1]}$$

$$H_{MLG/Ni} = V_{MLG}H_{MLG} + V_{Ni}H_{Ni} \qquad \text{[Equation 2]}$$

In Equation 1, $E_{MLG}$ is the measured Young's modulus of the graphene layer, and $E_{Ni}$ is the measured Young's modulus of nickel. In Equation 2, $H_{MLG}$ is the measured hardness of the graphene layer, and $H_{Ni}$ is the measured hardness of nickel. In Equations 1 and 2, $V_{MLG}$ means a volume fraction of the graphene layer in the two-layer structure of the graphene layer (MLG) and nickel (Ni), and $V_{Ni}$ means a volume fraction of nickel in the two-layer structure of the graphene layer (MLG) and nickel (Ni).

From Tables 1 and 2 above, in Equations 1 and 2 above, $E_{Ni}$ was set to 40.35 GPa, $E_{MLG(160\ nm)}$ was set to 62.05 GPa, $H_{Ni}$ was set to 1.76 GPa, and $H_{MLG(160\ nm)}$ was set to 4.22 GPa. The volume fractions of the graphene layer (MLG) and nickel (Ni) were calculated based on the load-penetration depth curves shown in FIGS. 8A and 8B. Considering the total thickness of the graphene layer (MLG) and the metal layer (Ni) and the thickness of the graphene layer, 160 nm, from the penetration depth of 338 nm of Example 1 and the penetration depth of 440 nm of Comparative Example 1, the volume fraction of the graphene layer (MLG) was 44% and the volume fraction of the metal layer (Ni) was 56% in Example 1, and the volume fraction of the graphene layer (MLG) was 34% and the volume fraction of the metal layer (Ni) was 66% in Comparative Example 1. Through this, the calculated Young's modulus value of the metal-graphene composite prepared in Example 1 was 49.98 GPa, and the calculated hardness value thereof was 2.85 GPa. Further, the calculated Young's modulus value of the metal-graphene composite prepared in Comparative Example 1 was 49.98 GPa, and the calculated hardness value thereof was 2.85 GPa.

Referring to FIG. 12, it was confirmed in the case of Examples 1 and 2 that the measured Young's modulus values and hardness values were greater than the calculated Young's modulus value and hardness value. Meanwhile, it was confirmed in the case of Comparative Example 1 that the measured Young's modulus value was similar to the calculated Young's modulus value, and the measured hardness value was smaller than the calculated hardness value. Through this, it can be seen that in the case of Examples 1 and 2, a strong interfacial bond is present between the metal layer and the graphene layer so that the mechanical properties are excellent, but in the case of Comparative Example 1, an interfacial bond is hardly present between the metal layer and the graphene layer.

FIG. 13 shows cross-sectional transmission electron microscope (TEM) images of the metal-graphene composites prepared in Example 1 and Comparative Example 1 which have been subjected to nanoindentation.

Specifically, FIG. 13A is a cross-sectional TEM image showing a deformed zone in the sample which has been subjected to indentation, FIG. 13B is a low-magnification STEM image near the indent of the metal-graphene composite prepared in Example 1 corresponding to the white dotted line box region of FIG. 13A, and FIG. 13C is a low-magnification STEM image near the indent of the metal-graphene composite prepared in Comparative Example 1 corresponding to the white dotted line box region of FIG. 13A. In this case, the direction of the white arrow in FIGS. 13A to 13C means a direction in which the load is applied. FIGS. 13D to 13F show a dislocation network structure of Comparative Example 1, FIGS. 13G to 13I show a dislocation network structure of Example 1, and the scale bar has a length of 100 nm. In this case, FIGS. 13D and 13G are high-magnification TEM images, FIGS. 13E and 13H are STEM images, and FIGS. 13F and 13I are dark field STEM images.

In order to confirm a difference of the microstructure in the same deformation, indentation was performed under displacement control with an indentation depth of 500 nm. Referring to FIG. 13A, a deformed zone near the indentation in the metal-graphene composites of Example 1 and Comparative Example 1 was observed using TEM.

FIGS. 13B and 13C are low-magnification STEM images showing a dislocation network in the deformed zone. It was confirmed that most of the dislocation bands were directed downward in parallel to the load direction in the case of Comparative Example 1, whereas the dislocation bands which were thin and had high density were uniformly distributed throughout in the case of Example 1.

Referring to FIGS. 13D and 13E, it can be confirmed in the case of Comparative Example 1 that thick dislocation bands were formed in the downward direction indicated by the red arrow. Meanwhile, referring to FIGS. 13G and 13H, a number of thin dislocation lines parallel to the surface of the sample were confirmed in addition to the vertical dislocation bands indicated by the yellow arrow in the case of Example 1. Referring to FIGS. 13F and 13I, it was confirmed that more dense and uniform dislocation lines appeared in the case of Example 1.

The fact that the metal-graphene composite prepared in Example 1 has excellent mechanical properties such as Young's modulus and hardness compared to the metal-graphene composite prepared in Comparative Example 1 is determined to be attributed to a strain-hardening effect due to more dislocations formed by deformation.

FIG. 14 shows the initial configuration of a graphene layer and a metal layer (Ni) in a molecular dynamics (MD) simulation. In FIG. 14, the gray upper layer represents the graphene layer, and the green lower layer represents the metal layer (Ni).

In order to grasp the mechanism by which the mechanical properties of the metal-graphene composite are strengthened, the molecular dynamics simulation was performed on the nanoindentation of the metal-graphene composite, focusing on the dislocation-interface interaction. As shown in FIG. 14, the system of the simulation consists of a graphene layer disposed parallel to the surface(111) of the single-crystalline nickel block.

FIG. 15 shows molecular dynamics simulation results for the metal-graphene composite according to an embodiment of the present disclosure. FIG. 15A shows the calculated load penetration depths for a single nickel(111) layer and GP/Ni(111) in which graphene is provided on nickel(111). The graph inserted in the upper left of FIG. 15A shows an enlarged curve up to a penetration depth of 5 Å. FIG. 15B shows total dislocation lengths of a single nickel layer (Ni(111)) and a double layer (Gp on Ni(111)) in which graphene is provided on nickel at penetration depths of 4.5 Å, 20 Å, and 50 Å.

In the MD simulation, there is a difference between a bilayer structure in which a single layer of graphene is provided on nickel(111) and a metal-graphene composite provided with a graphene layer containing a plurality of graphene thin films on polycrystalline nickel. However, it is confirmed that the load-penetration depth curve of the structure in which single-layer graphene is provided on nickel(111), obtained through the MD simulation, corresponds well to the experimental result of the metal-graphene composite according to an embodiment of the present disclosure.

As can be inferred from FIG. 15A, graphene/nickel(111) requires about twice as much load as a single nickel(111) layer in order to achieve the same penetration depth. In particular, the single nickel(111) layer needed more load than a graphene/nickel(111) bilayer structure up to a penetration depth of 4.5 Å, but this trend was reversed as the depth of penetration increases.

FIG. 16 shows load-penetration depth curves for the nickel foil and the metal-graphene composite prepared in Example 1. Specifically, FIG. 16 shows the load-penetration depth curves for the nickel foil prepared in Example 1 and the metal-graphene composite prepared in Example 1. Referring to FIG. 16, it was confirmed that the load carrying capacity of the nickel single layer (nickel foil) and that of the metal-graphene composite prepared in Example 1 were reversed at a penetration depth of about 17 nm.

In order to confirm various load carrying capacities of the nickel(111) single layer and the graphene/nickel(111) double layer, dislocation's nucleation and evolution were analyzed using an open visualization tool (OVITO).

Dislocation analysis was performed on a single nickel layer (Ni) and a double layer (GP/Ni) in which graphene was provided on nickel at penetration depths of 4.5 Å, 20 Å, and 50 Å using the open visualization tool (OVITO), and the results are shown in Table 3 below.

TABLE 3

| | | | Dislocation length (Å) | | | | | |
|---|---|---|---|---|---|---|---|---|
| | Depth (Å) | Analysis volume (Å³) | ½ <110> (Perfect) | ⅓ <100> (Hirth) | ⅓ <111> (Frank) | ⅙ <110> (Stair-rod) | ⅛ <112> (Shockley) | Other | Total dislocation length |
| GP/Ni | 4.5 | 4565240 | 0 | 6 | 12 | 206 | 1009 | 13 | 1245 |
| | 20 | 4500240 | 23 | 83 | 10 | 226 | 3326 | 232 | 3899 |
| | 50 | 4994700 | 116 | 309 | 11 | 791 | 8276 | 1206 | 10709 |
| Ni | 4.5 | 4133760 | 12 | 74 | 0 | 44 | 1350 | 28 | 1509 |
| | 20 | 4507040 | 8 | 79 | 9 | 213 | 3341 | 039 | 3889 |
| | 50 | 4473200 | 64 | 110 | 41 | 1468 | 4070 | 358 | 6117 |

Referring to FIG. 15B and Table 3, it was confirmed that the total dislocation lengths of the nickel(111) single layer and the graphene/nickel(111) double layer increased as the penetration depth increased. However, similarly to the trend of load carrying capacity, it was confirmed that more dislocations occurred in the nickel(111) single layer than the graphene/nickel(111) double layer at a low penetration depth, but this trend was reversed as the penetration depth increased.

FIGS. 15C to 15H show the dislocation distributions in the nickel(111) single layer and the graphene/nickel(111) double layer according to the indentation step. In particular, referring to FIGS. 15C and 15F, it was confirmed at the penetration depth of 4.5 Å that the dislocation was nucleated and evolved from the indent in the case of the nickel (111) single layer, whereas the dislocation hardly occurred in the case of the graphene/nickel(111) double layer. As the penetration depth increased to 5 Å or more, the dislocation density in the nickel(111) single layer and the graphene/nickel(111) double layer increased, confirming that the difference in dislocation distribution was clearly shown. Referring to 15D and 15G, it was confirmed at the penetration depth of 20 Å that dislocation was concentrated near the center of the indent in the case of the nickel(111) single layer, but the dislocation was distributed near the indent in the case of the graphene/nickel(111) double layer. Referring to FIGS. 15E and 15H, it was confirmed at the penetration depth of 50 Å that the indent was formed deep in the case of the nickel(111) single layer, but the indent was distributed over a wide area near the indenter in the case of the graphene/nickel(111) double layer.

Such a phenomenon can be explained based on the elasticity of graphene, and in the case of the graphene/nickel (111) double layer, the region around the indenter is deformed to form a wide indent. As it is confirmed that the total dislocation lengths are increased through FIG. 15B, graphene-coated nickel causes many dislocations around the indenter in a direction parallel to graphene, which may lead to a strain-hardening effect in the graphene/nickel(111) double layer. The dislocation distribution of the graphene/nickel(111) double layer obtained through the MD simulation is similar to that obtained in the TEM image of the metal-graphene composite prepared in Example 1, and thus it was confirmed that the high-density dislocation phenomenon appeared in the direction parallel to the surface of nickel. It can be seen based on the results obtained through the MD simulations and nanoindentation experiments that a strong bond is formed between the graphene layer and the metal layer in the metal-graphene composite according to an embodiment of the present disclosure, and thus the metal-graphene composite can have a larger load carrying capacity than the nickel single layer by the interface-induced strengthening.

The invention claimed is:

1. A metal-graphene composite comprising:
a metal layer; and
a graphene layer provided by being grown directly on one surface of the metal layer,
wherein the graphene layer contains two or more graphene thin films and
wherein the graphene thin films contain single-crystalline graphite grains each having a diameter of 10 μm or less and
wherein the metal layer contains nickel (Ni) and
wherein the graphene layer has a thickness of 100 nm or more and 300 nm or less and
wherein the metal layer and the graphene layer have a thickness ratio of 1:0.005 to 1:0.05 and
wherein the metal layer has a thickness of 10 μm or more and 50 μm or less and
wherein the distance between the metal layer and the graphene thin film adjacent to the metal layer along a thickness direction is smaller than the distance between the graphene thin films contained in the graphene layer and
wherein the metal-graphene composite has a Young's modulus of 160 GPa or more.

2. The metal-graphene composite of claim 1, having a hardness of 2 GPa or more.

3. The metal-graphene composite of claim 1, having a stiffness of $2.0 \times 10^{-6}$ N/m or more.

4. The metal-graphene composite of claim 1, wherein the graphene thin films contain grains oriented in a vertical direction along a plane.

5. The metal-graphene composite of claim 1, wherein the graphene layer comprises a D peak of 1,350 $cm^{-1}$ which is not observed in the Raman spectrum.

6. The metal-graphene composite of claim 1, wherein the metal layer further contains at least one of copper (Cu), cobalt (Co), iron (Fe), manganese (Mn), chromium (Cr), vanadium (V), titanium (Ti), platinum (Pt), gold (Au), aluminum (Al), magnesium (Mg), rhodium (Rh), tungsten (W), zirconium (Zr), and tantalum (Ta).

\* \* \* \* \*